US012796418B2

(12) United States Patent
Gaudin et al.

(10) Patent No.: US 12,796,418 B2
(45) Date of Patent: Nov. 10, 2026

(54) COMPOSITE STRUCTURE COMPRISING A USEFUL MONOCRYSTALLINE SIC LAYER ON A POLYCRYSTALLINE SIC CARRIER SUBSTRATE AND METHOD FOR MANUFACTURING SAID STRUCTURE

(71) Applicant: Soitec, Bernin (FR)

(72) Inventors: Gweltaz Gaudin, Bernin (FR); Christophe Maleville, Bernin (FR); Sidoine Odoul, Bernin (FR); Ionut Radu, Bernin (FR); Hugo Biard, Bernin (FR)

(73) Assignee: Soitec, Bernin (FR)

( * ) Notice: Subject to any disclaimer, the term of this patent is extended or adjusted under 35 U.S.C. 154(b) by 319 days.

(21) Appl. No.: 18/694,369

(22) PCT Filed: Sep. 20, 2022

(86) PCT No.: PCT/FR2022/051765
§ 371 (c)(1),
(2) Date: Mar. 21, 2024

(87) PCT Pub. No.: WO2023/057699
PCT Pub. Date: Apr. 13, 2023

(65) Prior Publication Data

US 2024/0395603 A1 Nov. 28, 2024

(30) Foreign Application Priority Data

Oct. 5, 2021 (FR) ....................................... 2110493

(51) Int. Cl.
*H01L 21/763* (2006.01)
*H01L 21/762* (2006.01)
(Continued)

(52) U.S. Cl.
CPC ........ *H10W 10/40* (2026.01); *H10D 62/8325* (2025.01); *H10P 90/1916* (2026.01); *H10W 10/041* (2026.01); *H10W 10/181* (2026.01)

(58) Field of Classification Search
CPC . H10W 10/40; H10W 10/041; H10W 10/181; H10D 62/8325; H10P 90/1916;
(Continued)

(56) References Cited

U.S. PATENT DOCUMENTS

| | | | |
|---|---|---|---|
| 7,208,392 | B1 | 4/2007 | Jaussaud et al. |
| 2005/0151155 | A1 | 7/2005 | Auberton-Herve |

(Continued)

FOREIGN PATENT DOCUMENTS

| | | | |
|---|---|---|---|
| EP | 3441506 A1 | 2/2019 |
| JP | H08-162408 A | 6/1996 |

(Continued)

OTHER PUBLICATIONS

Korean Office Action for Application No. 10-2024-7014742 dated Feb. 3, 2026, 11 pages with machine translation.

(Continued)

*Primary Examiner* — Tong-Ho Kim
(74) *Attorney, Agent, or Firm* — TraskBritt

(57) ABSTRACT

A method for manufacturing a composite structure having a layer of monocrystalline silicon carbide on a polycrystalline silicon carbide carrier substrate includes: providing an initial substrate of polycrystalline silicon carbide, having a front face and comprising grains, the average size of which is greater than 0.5 μm; forming a polycrystalline silicon carbide surface layer on the initial substrate to form the carrier substrate, the surface layer including grains having an average size of less than 500 nm and having a thickness of between 50 nm and 50 μm; preparing a free surface of the surface layer of the carrier substrate to obtain a roughness of (Continued)

less than 1 nm RMS; (d) a step of transferring the useful layer onto the carrier substrate, by applying molecular bonding, the surface layer located between the useful layer and the initial substrate. A carrier substrate and a composite structure are formed by the method.

20 Claims, 4 Drawing Sheets

(51) Int. Cl.

| | |
|---|---|
| ***H01L 29/16*** | (2006.01) |
| ***H10D 62/832*** | (2025.01) |
| ***H10P 90/00*** | (2026.01) |
| ***H10W 10/00*** | (2026.01) |
| ***H10W 10/10*** | (2026.01) |
| ***H10W 10/40*** | (2026.01) |

(58) Field of Classification Search

CPC .... H10P 10/128; H10P 90/00; H10P 90/1904; H10P 14/3454; H10P 14/43; H10P 14/432; H10P 52/402

USPC .......................................................... 257/77

See application file for complete search history.

(56) References Cited

U.S. PATENT DOCUMENTS

| | | | |
|---|---|---|---|
| 2013/0040103 A1 | 2/2013 | Asamura et al. | |
| 2017/0330747 A1* | 11/2017 | Akiyama | C23C 16/0227 |
| 2018/0334757 A1 | 11/2018 | Kubota et al. | |
| 2021/0125826 A1 | 4/2021 | Myers-Ward et al. | |
| 2024/0379351 A1* | 11/2024 | Biard | H10P 14/2904 |

FOREIGN PATENT DOCUMENTS

| | | | |
|---|---|---|---|
| JP | 2000-182944 | A | 6/2000 |
| JP | 2002-009073 | A | 1/2002 |
| JP | 2010-235392 | A | 10/2010 |
| JP | 2015-220321 | A | 12/2015 |
| JP | 2020-090421 | A | 6/2020 |
| JP | 2021-082765 | A | 5/2021 |
| KR | 10-2018-0126566 | A | 11/2018 |
| TW | 202121505 | A | 6/2021 |
| WO | 2016/088466 | A1 | 6/2016 |

OTHER PUBLICATIONS

Chichignoud et al., High Temperature Processing of Poly=SiC Substrates from the Vapor Phase for Wafer-Bonding, Surface and Coatings Technology, vol. 201, Issue 7, (Dec. 2006), pp. 4014-4020.

International Search Report for Application No. PCT/FR2022/051765 dated Dec. 23, 2022, 2 pages.

International Written Opinion for Application No. PCT/FR2022/051765 dated Dec. 23, 2022, 6 pages.

Letertre et al., QuaSiC Smart-Cut Substrates for SiC High Power Devices, Material Science Forum, vols. 389-393, (2002), pp. 151-154.

Taiwanese Office Action and Search Report for Application No. 111135615 dated Feb. 25, 2026, 8 pages with machine translation.

Japanese Notice of reasons for Refusal for Application No. 2024-519070 dated Aug. 27, 2026, 24 pages with translation.

* cited by examiner

COMPOSITE STRUCTURE COMPRISING A USEFUL MONOCRYSTALLINE SIC LAYER ON A POLYCRYSTALLINE SIC CARRIER SUBSTRATE AND METHOD FOR MANUFACTURING SAID STRUCTURE

CROSS REFERENCE TO RELATED APPLICATIONS

This application is a national phase entry under 35 U.S.C. § 371 of International Patent Application PCT/FR2022/051765, filed Sep. 20, 2022, designating the United States of America and published as International Patent Publication WO 2023/057699 A1 on Apr. 13, 2023, which claims the benefit under Article 8 of the Patent Cooperation Treaty to French Patent Application Serial No. FR2110493, filed Oct. 5, 2021.

TECHNICAL FIELD

The present disclosure relates to the field of semiconductors for microelectronic components. It, in particular, relates to a composite structure comprising a working layer made of single-crystal silicon carbide placed on a carrier substrate made of polycrystalline silicon carbide, and to a process for fabricating the composite structure. The present disclosure also relates to the carrier substrate made of polycrystalline silicon carbide.

BACKGROUND

SiC is increasingly widely used to fabricate innovative power devices, to meet the needs of growing fields of application of electronics, such as electric vehicles, in particular.

Power devices and integrated power-supply systems based on single-crystal silicon carbide are able to manage a much higher power density than their conventional silicon equivalents, and to do so with active regions of smaller size. In order to further limit the dimensions of power devices on SiC, it would be advantageous to fabricate vertical components rather than lateral components. To do this, vertical electrical conduction, between an electrode placed on the front side of the SiC structure and an electrode placed on the back side, must be permitted by the structure.

Nevertheless, single-crystal SiC substrates intended for the microelectronics industry remain expensive and difficult to supply in large sizes. It is therefore advantageous to employ thin-layer transfer solutions to produce composite structures, which typically comprise a thin layer (the thin layer) made of single-crystal SiC (c-SiC) on a less expensive single-crystal (c-SiC) or polycrystalline (p-SiC) carrier substrate. One well-known thin-layer transfer solution is the Smart Cut® process, based on implanting light ions and joining by direct bonding at a bonding interface. The bonding interface must have the lowest possible resistivity, preferably one lower than 1 mohm·cm$^2$, or even lower than 0.1 mohm·cm$^2$.

Many prior-art solutions propose to use conductor-conductor bonding based on metal layers deposited on the surfaces to be joined. For example, the publication by Letertre ("Silicon carbide and related materials," Material Science Forum—vol 389-393, April 2002) or document U.S. Pat. No. 7,208,392, describes the deposition of a layer of tungsten and of a layer of silicon in order to form a conductive intermediate layer based on tungsten silicide (WSi2). One drawback of this approach may arise from the formation of voids in this intermediate layer, due to the contraction of the silicide with respect to the initially deposited materials: in particular, this may affect the quality of the surface semiconductor layer and potentially of the semiconductor structure in its entirety. In addition, with this type of intermediate layer, it is difficult to lower the resistivity of the bonding interface to the level needed by some applications requiring a very good vertical electrical conduction.

It is also contemplated to join the SiC surfaces of the working layer and of the carrier substrate directly, but this remains difficult, in particular, when a polycrystalline carrier substrate is involved, the problem then being how to transfer a single-crystal working layer, by direct bonding, with the required bonding-interface quality (low defect density, high bonding energy, very low resistivity). G. Chichignoud et al ("Processing of poly-SiC substrate with large grains for wafer bonding"—Materials Science Forum, vols 527-529, p71-74 (2006)) proposes to transfer a single-crystal SiC layer to a polycrystalline SiC carrier substrate that has thermal and electrical properties favorable to power microelectronic applications, and physical properties (surface roughness, curvature) compatible with direct bonding. The grains of the SiC poly-crystal are chosen to be large in size (typically larger than 1 cm in size) and the chemical-mechanical polishing carried out to prepare the surface before joining allows average roughness lower than 5 nm to be obtained.

Document EP3441506 provides p-SiC carrier substrate to which a c-SiC semiconductor layer may be transferred, via direct bonding. The carrier substrate has grains of average size on the order of 10 μm and exhibits a degree of variation in grain size between its front and back sides, divided by its thickness, of less than or equal to 0.43%, which makes it possible to limit the residual stress in the carrier substrate and therefore its curvature. An average roughness lower than 1 nm is achieved on the surface of the carrier substrate to be joined to the layer made of c-SiC.

With carrier substrates made of p-SiC such as proposed in the above two documents, the applicant has nevertheless observed residual reliefs (recesses or bumps) due to irregular removal of inter-grain regions or to uprooting of all or some of the surface grains, which affects the quality of the bonding interface (bonding defects) and therefore the overall performance of the obtained composite structure.

BRIEF SUMMARY

The present disclosure provides an alternative to the prior-art solutions, aiming to overcome all or some of the aforementioned drawbacks. The disclosure relates to a process for fabricating a composite structure comprising a working layer made of single-crystal SiC transferred to a carrier substrate made of polycrystalline SiC. The present disclosure also relates to the carrier substrate and to the obtained composite structure.

The present disclosure relates to a process for fabricating a composite structure comprising a working layer made of single-crystal silicon carbide placed on a carrier substrate made of polycrystalline silicon carbide, the process comprising:

a) a step of providing an initial substrate made of polycrystalline silicon carbide, having a front side and comprising grains, the average size of which, in the plane of the front side, is larger than 0.5 μm;

b) a step of forming a surface layer made of polycrystalline silicon carbide on the initial substrate, in order to form the carrier substrate, the surface layer being made up of grains, the average size of which is smaller than 500 nm, and having a thickness between 50 nm and 50 μm;

c) a step of preparing a free surface of the surface layer of the carrier substrate, in order to obtain a roughness lower than 1 nm RMS;

d) a step, based on molecular bonding, of transferring the working layer to the carrier substrate, the surface layer being positioned between the working layer and the initial substrate.

According to other advantageous and non-limiting features of the present disclosure, which are applicable individually or in any technically feasible combination:

step a) is carried out using a chemical-vapor-deposition technique, at a temperature between 1100° C. and 1500° C.;

step a) is carried out using a sintering technique or using a physical-vapor-deposition technique;

step b) comprises depositing a layer made of polycrystalline silicon carbide and is carried out using a chemical-vapor-deposition technique at a temperature lower than or equal to 1100° C., or even lower than or equal to 1000° C.;

step b) is carried out in the same item of equipment as step a) and following step a), without bringing the initial substrate back to ambient atmosphere;

step b) comprises depositing a layer made of amorphous silicon carbide on the initial substrate and carrying out a recrystallization anneal, in order to form the surface layer made of polycrystalline silicon carbide;

the surface layer formed in step b) has a dopant concentration between $1E18/cm^3$ and $1E21/cm^3$;

step c) comprises a chemical-mechanical polish of the surface layer, involving removal of an amount between 1 and 10 times the average size of the grains making up the surface layer;

step d) comprises the following phases:

d1) providing a donor substrate;

d2) introducing light species into the donor substrate in order to form a buried weak plane delineating, with a front side of the donor substrate, the working layer to be transferred;

d3) joining the front side of the donor substrate to the carrier substrate, by molecular bonding;

d4) separating along the buried weak plane, leading to the transfer of the working layer to the carrier substrate;

the fabricating process comprises forming a second surface layer, of the same nature as the surface layer, on the front side of the donor substrate, before or after the phase d2);

step d) comprises, before the joining phase d3), depositing an additional film made of a metal or of silicon on the surface layer of the carrier substrate and/or on the front side of the donor substrate.

The present disclosure also relates to a carrier substrate made of polycrystalline silicon carbide, comprising:

an initial substrate comprising silicon-carbide grains, the grains having an average size larger than 0.5 μm, a surface layer placed at least on a front side of the initial substrate, comprising silicon-carbide grains, the average size of which is smaller than 500 nm, and having a thickness between 50 nm and 50 μm.

According to other advantageous and non-limiting features of the present disclosure, which are applicable individually or in any technically feasible combination:

a free surface of the surface layer has a roughness lower than 1 nm RMS and less than 1 defect/$cm^2$, as measured by reflected dark-field microscopy, with a threshold of 0.5 μm;

the thickness of the surface layer is between 200 nm and 5 μm;

the surface layer has a dopant concentration between $1E18/cm^3$ and $1E21/cm^3$.

Lastly, the present disclosure relates to a composite structure comprising:

the carrier substrate such as mentioned above, a working layer made of single-crystal silicon carbide placed on the surface layer.

The composite structure may further comprise at least one power device on or in the working layer.

BRIEF DESCRIPTION OF THE DRAWINGS

Other features and advantages of the present disclosure will become apparent on reading the following detailed description of example embodiment of the present disclosure, with reference to the appended figures, in which.

The same references in the figures may be used for elements of the same type. The figures are schematic representations that, for the sake of readability, have not been drawn to scale. In particular, the thicknesses of the layers along the z-axis are not to scale with respect to the lateral dimensions along the x- and y-axes; and the relative thicknesses of the layers with respect to one another have not necessarily been respected in the figures.

DETAILED DESCRIPTION

Figure 1:
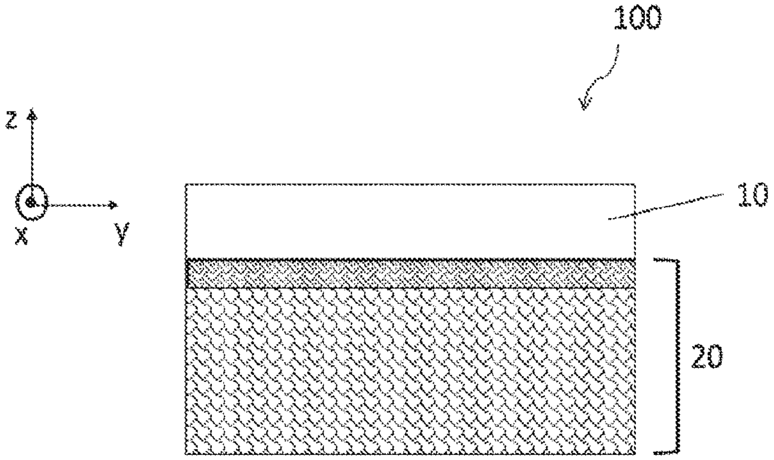
FIG. 1 shows a composite structure produced using a fabricating process according to the present disclosure.

The present disclosure relates to a process for fabricating a composite structure 100 comprising a working layer 10 made of single-crystal silicon carbide ("c-SiC" will be used below to refer to single-crystal silicon carbide) placed on a carrier substrate 20 (FIG. 1). The carrier substrate 20 is made of polycrystalline silicon carbide ("p-SiC" will be used to refer to polycrystalline SiC). It will be noted that, with regard to production of microelectronic components on and/or in the working layer 10 of the composite structure 100, it is usually desirable for the free side of the working layer 10 made of c-SiC to be a silicon face.

Figure 2A:
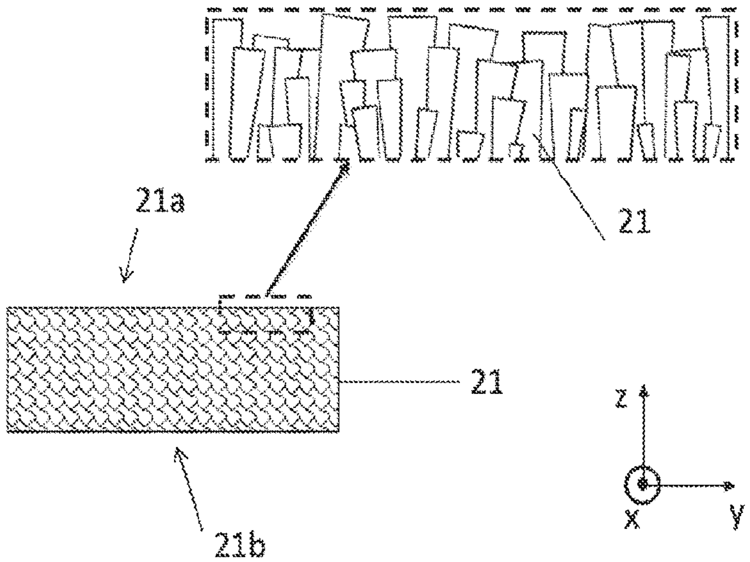
FIGS. 2A-2D show steps of a fabricating process according to the present disclosure.

The process first comprises a step a) of providing an initial substrate 21 made of polycrystalline silicon carbide, which substrate is intended to give the carrier substrate 20 its mechanical properties (FIG. 2A). In other words, the initial substrate 21 represents most of the thickness of the carrier substrate 20. It preferably takes the form of a wafer of 100 mm or 150 mm, or even 200 mm diameter, with a front side 21*a* and a back side 21*b*, and of thickness typically between 200 μm and 800 μm.

The polycrystalline initial substrate 21 comprises grains of 4H, 6H and/or 3C silicon carbide. The grains have an average size, in the plane of the front side 21*a*, larger than 0.5 m, and typically between 1 μm and 10 μm. The size of a grain, delineated by its grain boundaries, corresponds to the largest dimension of the grain, in the plane of the front side 21*a*. The average size of the grains is defined by the average of the sizes of the various grains in the plane of the front side 21*a*. Grains of very small size, typically smaller than 50 nm, are preferably excluded from the measurement to limit measurement uncertainties. It is possible to base the measurement of the dimensions of the grains or of distances between grain boundaries on images obtained by conventional scanning electron microscopy (SEM) or involving electron back-scattered diffraction (EBSD). It is also possible to use X-ray crystallography.

Grains of p-SiC of large dimensions are favorable to a good thermal conductivity and are therefore preferred with respect to the initial substrate 21. For the targeted applications (vertical electronic components), a thermal conductivity higher than 200 W/m/K, and preferably higher than 250 W/m/K, and a resistivity lower than 10 mohm·cm, and preferably lower than 5 mohm·cm, are expected from the carrier substrate 20. Such electrical and thermal characteristics are therefore chosen for the initial substrate 21. The initial substrate 21 preferably has a dopant concentration between $1E18/cm^3$ and $1E21/cm^3$, and typically between $1E19/cm^3$ and $1E20/cm^3$. Even though p- and n-type dopants are contemplated, it is conventional, for the electronic devices that will be produced on the composite structure 100, to employ n-type dopants, such as nitrogen dopants, for example.

Step a) may be carried out using known prior-art techniques such as sintering, physical vapor deposition (PVD) or even chemical vapor deposition (CVD). Sintered substrates are advantageous because of their relatively limited cost. CVD techniques are advantageous in that they allow high-quality p-SiC substrates of large diameter to be obtained; the deposition is preferably performed at a temperature between 1100° C. and 1500° C.

Many trials of procedures for preparing the surface of an initial substrate 21 have been performed, such as mentioned above, with a view to transferring a working layer to its front side 21*a*. The typical initial RMS roughness of the front side of the initial substrate 21 may vary from a few nanometers to a few microns (as measured by atomic force microscopy (AFM) in scans of 20 μm×20 μm), depending on the production technique and on the smoothing treatments applied by the supplier. Chemical-mechanical polishing is required to decrease this roughness (which is required to be lower than 1 nm RMS, or even lower than 0.5 nm RMS), so as to ensure a direct molecular bond of excellent quality and hence a transferred working layer 10 of excellent quality.

It is known that SiC is a material that is difficult to polish because of its hardness. It has been observed that polishing a surface made of p-SiC uproots grains or segments of grains locally, leaving voids and other defects in the polished surface. Even though the roughness may reach the required values after polishing at localized regions, on the scale of the substrate, the density of voids and other surface defects remains high.

Figure 2B:
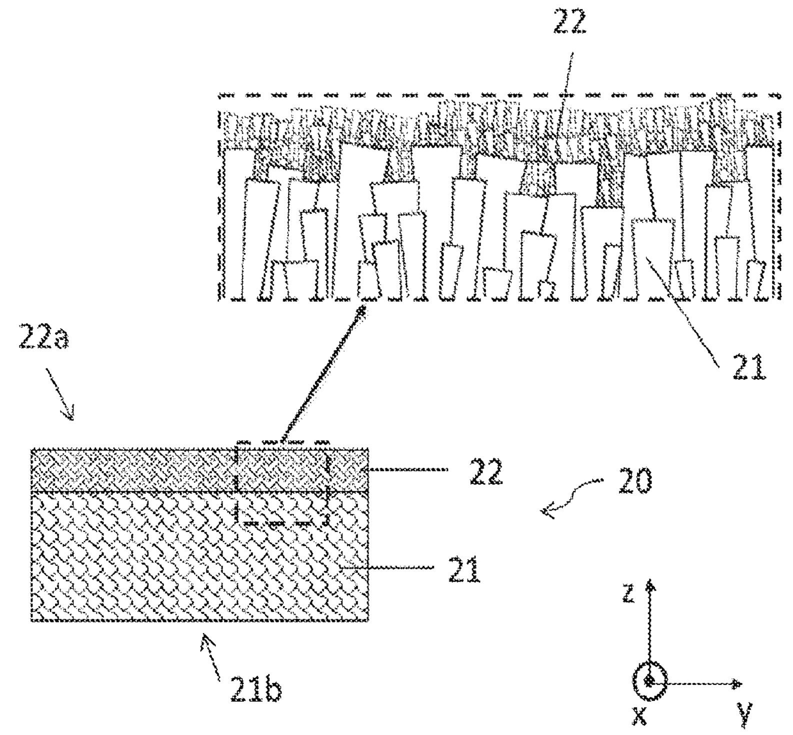

To address this problem with defect density, the fabricating process according to the present disclosure comprises a step b) of forming, on the initial substrate 21, a surface layer 22 made of polycrystalline silicon carbide of particular morphology, in order to allow a surface suitable for a high-quality molecular bond to be prepared without significantly degrading the thermal and electrical properties expected from the carrier substrate 20 (FIG. 2B). The formed carrier substrate 20 includes the initial substrate 21 and the surface layer 22, and has a front side 22*a* (the free side of the surface layer 22) and a back side 21*b* (the back side of the initial substrate 21).

It will be noted that a layer, of the same nature as the surface layer 22, could optionally also be deposited on the back side 21*b* of the initial substrate 21 (not shown), in particular, in order to avoid impacting the curvature of the initial substrate 21.

The surface layer 22 is formed on the front side 21*a* of the initial substrate 21, without a prior polishing step. The roughness of the initial substrate 21, at the moment of the deposition of step b), is therefore typically between 10 nm and 3000 nm RMS.

The thickness of the surface layer 22, which is between 50 nm and 50 μm, and typically between 100 nm and 5 μm, is adjusted depending on the roughness of the initial substrate 21. For a roughness of the substrate 21 of about 15 nm RMS, the thickness of the surface layer 22 is preferably chosen between 200 nm and 500 nm.

The surface layer 22 is composed of grains of 4H, 6H and/or 3C silicon carbide. These grains have an average size smaller than 500 nm, or even smaller than 100 nm, and typically between 10 nm and 100 nm. The size of a grain, delineated by its grain boundaries, corresponds to the largest dimension of the grain, in the plane of the free surface of the surface layer 22. The average size of the grains is defined by the average of the sizes of the various grains in the plane.

The p-SiC surface layer 22 advantageously has a, p- or n-type, dopant concentration between $1E18/cm^3$ and $1E21/cm^3$, and typically between $1E19/cm^3$ and $1E20/cm^3$. The doping type of the surface layer 22 is generally chosen to be identical to that of the initial substrate 21, and the doping level (dopant concentration) of the surface layer 22 is generally chose to be higher than that of the initial substrate 21.

According to a first embodiment, step b) comprises depositing silicon carbide in polycrystalline form to form the surface layer 22.

Advantageously, the deposition is performed using a chemical-vapor-deposition technique, in particular, at low pressure (LPCVD) and at a temperature lower than or equal to 1100° C., or even lower than or equal to 1000° C. By decreasing the deposition temperature, surface diffusion decreases, causing an increase in the number of nucleation sites, which promotes formation of very small p-SiC grains. Since the thickness of the surface layer 22 in general remains small (typically smaller than 5 μm), the average size of the grains may easily be kept smaller than 500 nm, or even smaller than 100 nm.

The precursors may be chosen from methylsilane, dimethyldichlorosilane, or even dichlorosilane and i-butane, preferably with a C/Si ratio higher than 1.

Of course, other temperatures may be implemented for the p-SiC deposition, for example, temperatures lower than 1400° C., provided that the aforementioned grain size is respected.

Even though step b) has been described as being carried out on the initial substrate 21, at the end of step a), it is contemplated for step b) to be performed with the same deposition technique and in the same item of equipment as step a), and following the step a), without bringing the initial substrate 21 back to ambient atmosphere.

According to a second embodiment, step b) comprises depositing silicon carbide in amorphous form, then carrying out an anneal to cause recrystallization into polycrystalline form, to form the surface layer 22.

The amorphous SiC may be deposited using a chemical-vapor-deposition technique (for example, plasma-enhanced chemical vapor deposition (PECVD) or direct-liquid-injection chemical vapor deposition (DLI-CVD)), using a physical-vapor-deposition technique, or using any other known technique. The recrystallization anneal is then carried out at a temperature typically higher than 900° C., and preferably higher than or equal to 1100° C., than 1200° C., or even than 1400° C. This anneal is carried out so as to obtain a surface layer 22 composed of grains of 4H, 6H and/or 3C silicon carbide having an average size smaller than 500 nm, or even smaller than 100 nm, and typically between 10 nm and 100 nm.

Figure 2C:
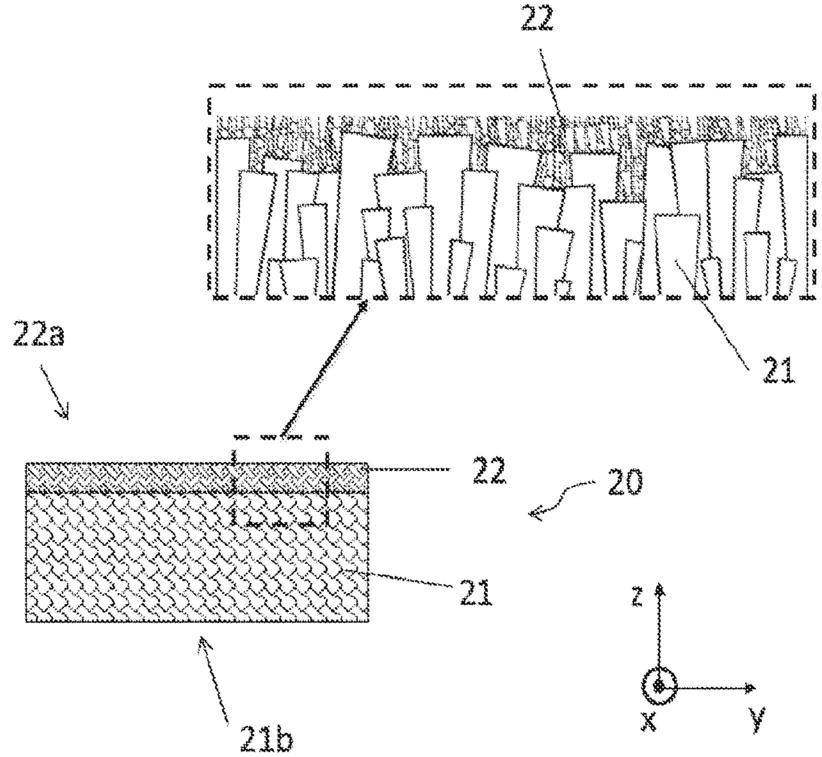

Returning to the general description of the process, the process then comprises a step c) of preparing the front side 22*a* of the surface layer 22 to obtain a roughness lower than or equal to 1 nm RMS, and advantageously lower than or equal to 0.5 nm RMS (FIG. 2C).

Step c) may be carried out in various ways:

by chemical smoothing (dry or wet etching), by heat treatment in a temperature range and atmosphere apt to smooth the surface of the surface layer 22, by chemical-mechanical polishing, using conventional silicon-carbide polishing processes, or even by mechanical polishing (fine grinding).

With reference to the mechanical polishing option, the nanoscale size of the p-SiC grains of the surface layer 22 is favorable in that it is very much smaller than the typical planarization length of chemical-mechanical-polishing techniques, which is on the order of 1 μm.

When step c) is based on chemical-mechanical polishing of the surface layer 22, it typically involves removing an amount between 1 and 10 times the average size of the grains of the surface layer 22, depending on the roughness of the initial substrate 21 and on the deposited thickness of surface layer 22.

Step c) allows a roughness lower than or equal to 1 nm RMS, and preferably lower than or equal to 0.5 nm RMS, and, for example, of about 0.1 nm to 0.5 nm RMS, to be obtained in spatial wavelength ranges ranging from a few tens of nanometers to a few tens of microns. After the smoothing, conventional cleaning (chemical cleaning potentially with brush scrubbing) is applied to the carrier substrate 20. The defect-density level obtained is very low, with fewer than 10 defects/$cm^2$, and preferably less than 1 defect/$cm^2$, as measured by reflected dark-field microscopy, with a threshold of 0.5 μm.

Figure 2D:
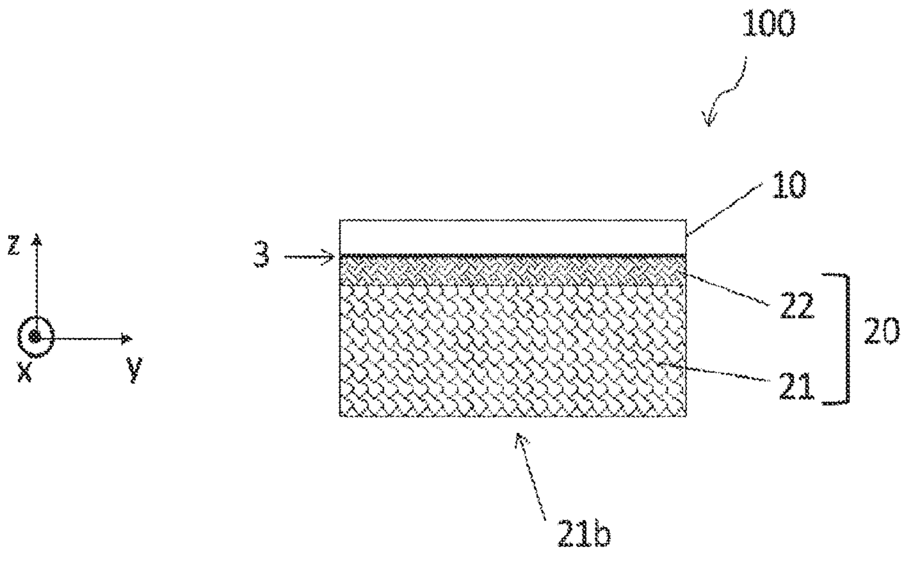

The process lastly comprises a step d), based on molecular bonding, of transferring a working layer 10 made of single-crystal silicon carbide to the carrier substrate 20: the surface layer 22 is then positioned between the working layer 10 and the initial substrate 21 (FIG. 2D).

It will be noted that a second surface layer may be formed, prior to the molecular bonding, on the side of the working layer 10 intended to be bonded to the carrier substrate 20. This has the advantage that layers (the surface layer 22 and the second surface layer) of the same nature, namely layers made of p-SiC nano-grains, are joined, which allows the quality of the direct molecular bond to be improved.

Various ways of transferring a layer are known in the art, and they will not be described here exhaustively.

According to one preferred embodiment, step d) of the process involves implanting light species according to the principles of the Smart Cut® process.

Figure 3A:
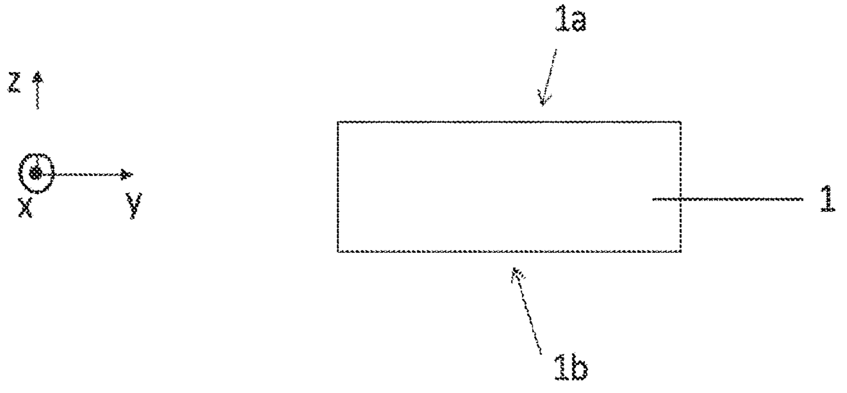
FIGS. 3A-3D show steps of one preferred embodiment of the fabricating process according to the present disclosure.

In a first phase d1), a donor substrate 1 made of single-crystal silicon carbide, from which the working layer 10 will be obtained, is provided (FIG. 3A). The donor substrate 1 preferentially takes the form of a wafer of 100 mm or 150 mm or even 200 mm diameter (identical to that of the carrier substrate 20) and of thickness typically between 300 m and 800 μm. The donor substrate 1 has a front side 1*a* and a back side 1*b*. The surface roughness of the front side 1*a* is advantageously chosen to be lower than 1 nm RMS, or even lower than 0.5 nm RMS, as measured by atomic force microscopy (AFM) in a 20 m×20 μm scan. In order to obtain a free silicon face for the working layer 10 in the composite structure 100, the front side 1*a* of the donor substrate 1 will be chosen to have a carbon face. The donor substrate 1 may be of 4H or 6H polytype, and may have n- or p-type doping, depending on the requirements of the components to be produced on and/or in the working layer 10 of the composite structure 100.

Figure 3B:
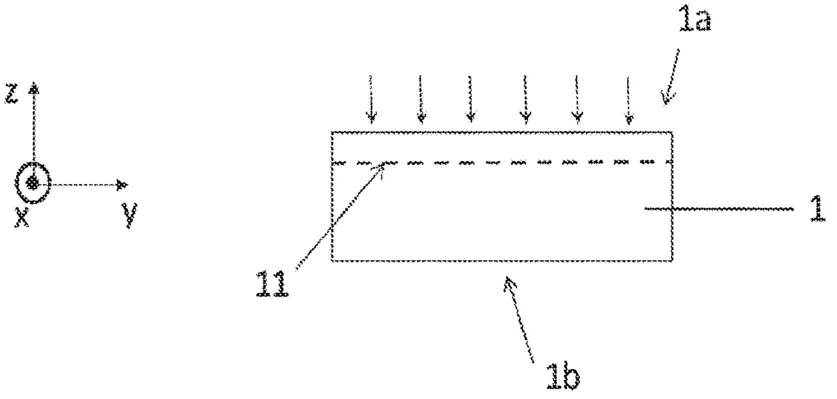

A second phase d2) includes introducing light species into the donor substrate 1 to form a buried weak plane 11 delineating, with a front side of the donor substrate 1, the working layer 10 to be transferred (FIG. 3B).

The light species are preferably hydrogen, helium or a co-implantation of these two species, and are implanted into the donor substrate 1 to a given depth, consistent with the targeted thickness of the working layer 10. These light species will form, around the given depth, micro-cavities distributed as a thin layer parallel to the front side 1*a* of the donor substrate 1, i.e., parallel to the plane (x,y) in the figures. This thin layer is referred to as the buried weak plane 11, for the sake of simplicity.

The energy of implantation of the light species is selected so as to reach the given depth. For example, hydrogen ions will be implanted at an energy between 10 keV and 250 keV, and at a dose between 5E16/$cm^2$ and 1E17/$cm^2$, to delineate a working layer 10 having a thickness of about 100 nm to 1500 nm. It will be noted that a protective layer will possibly be deposited on the front side 1*a* of the donor substrate 1, prior to the ion implantation step. This protective layer may be made of a material such as silicon oxide or silicon nitride, for example. The protective layer is removed prior to the next phase.

Optionally, as was mentioned above, a second surface layer (of the same nature as the surface layer 22) may be formed on the front side 1*a* of the donor substrate 1, before or after the second phase d2) of introducing the light species. This second surface layer will possibly be formed and prepared under the aforementioned conditions of steps b) and c).

In the case where the second surface layer is formed before phase d2), the implantation energy (and potentially the dose) of the light species will be adjusted so that they pass through this additional layer. In the case where the second surface layer is formed after phase d2), care will be taken to form this second surface layer with a thermal budget lower than the blistering thermal budget, the blistering thermal budget corresponding to the appearance of blisters on the surface of the donor substrate 1 as a result of growth and excessive pressurization of the micro-cavities in the buried weak plane 11.

Figure 3C:
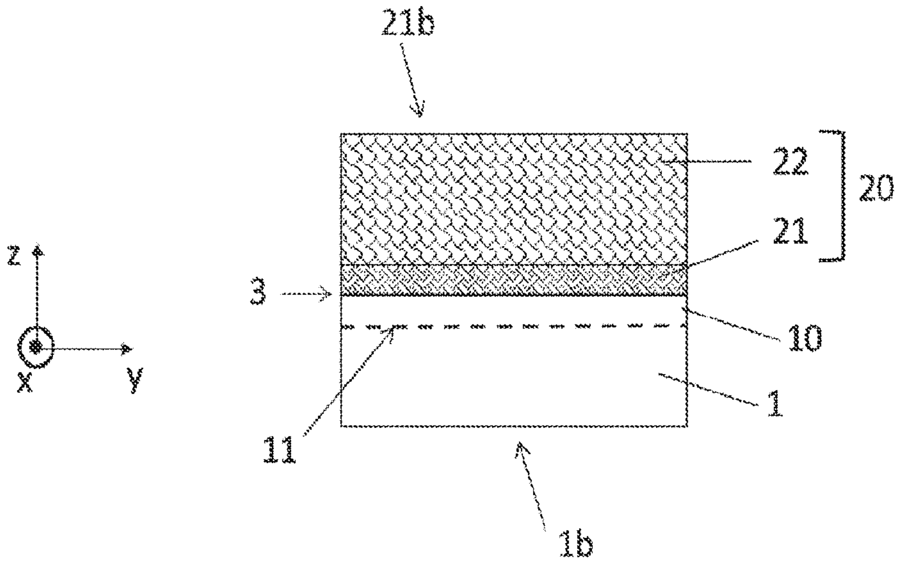

The transferring step d) then comprises a third phase d3) of joining the front side 1*a* of the donor substrate 1 to the front side 22*a* of the carrier substrate 20, by molecular bonding, along a bonding interface 3 (FIG. 3C).

As is well known per se, direct molecular bonding does not require an adhesive, as bonds form on the atomic scale between the joined surfaces. There are several types of molecular bonding, which, in particular, differ in their conditions in respect of temperature, pressure or atmosphere or of treatments carried out before the surfaces are brought into contact. Mention may be made of bonding at room temperature with or without prior plasma activation of the surfaces to be joined, atomic diffusion bonding (ADB), surface activated bonding (SAB), etc.

The joining phase d3) may comprise, before the sides 1*a*, 22*a* to be joined are brought into contact, conventional sequences of chemical cleaning (for example, RCA cleaning) and of surface activation (for example, by means of oxygen or nitrogen plasma) or other surface preparations (such as brush scrubbing), which are likely to promote the quality of the bonding interface 3 (low defect density, high adhesion energy).

The low defect-density and roughness level of the front side 22*a* of the carrier substrate 20 (because of the surface preparation of the surface layer 22) is particularly advantageous for obtaining a high-quality bonding interface 3. In the case where the donor substrate 1 is also equipped with a second surface layer of the same nature as the surface layer 22 of the carrier substrate 20, the quality of the direct bond may be further improved because two surfaces of the same polycrystalline nature, or even of the same polytype, 3C preferably, are joined.

Optionally, step d) comprises, before the joining phase d3), depositing an additional film made of a metal or of amorphous or polycrystalline silicon on the prepared front side 22*a* of the surface layer 22 and/or on the front side of the donor substrate 1. The metal will possibly be chosen from tungsten, nickel, titanium, etc. Since the surface roughness of the front side 22*a* of the surface layer 22 is very low, the thickness of this additional film is advantageously limited, and typically between a few nanometers and a few tens of nanometers. The purpose of the additional film is essentially to increase bonding energy (in particular, at intermediate temperatures below 1100° C.), this increase being due to the formation of covalent bonds at lower temperatures than in the case of two directly joined SiC surfaces. Another advantage of this additional film may be to improve the vertical electrical conduction of the bonding interface 3.

Figure 3D:
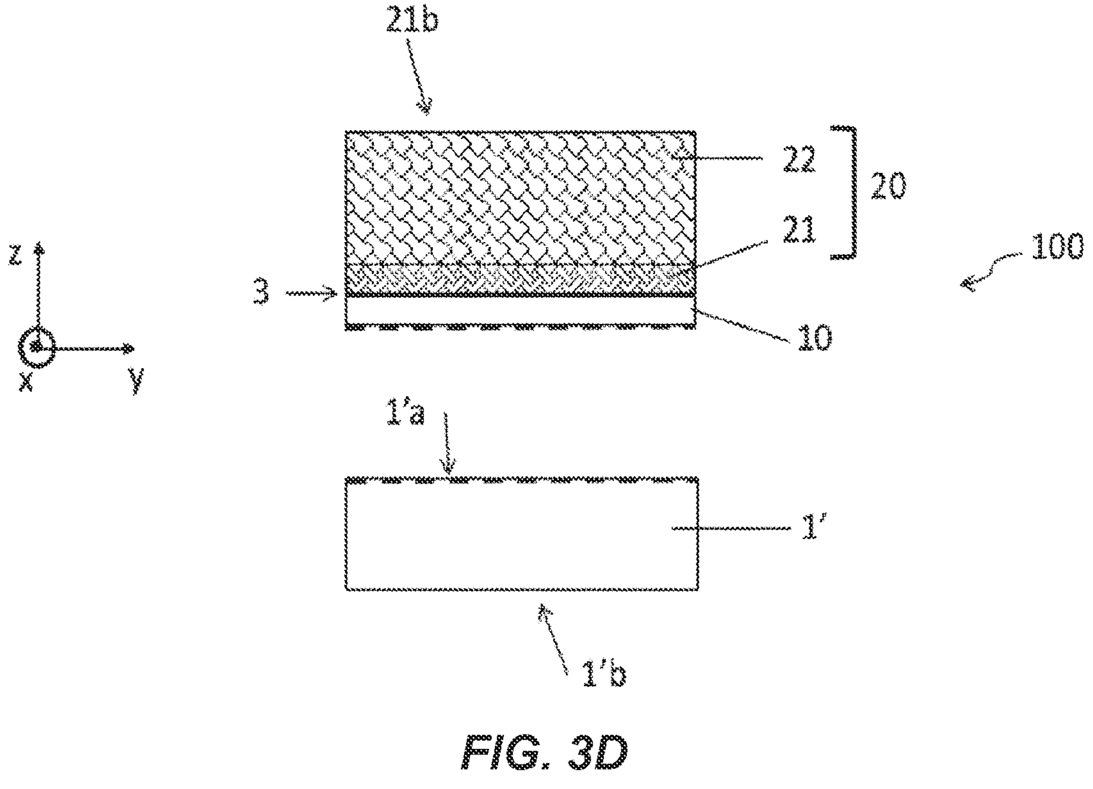

Lastly, a fourth step d4) comprises separation along the buried weak plane 11, which leads to the transfer of the working layer 10 to the carrier substrate 20 (FIG. 3D).

The separation along the buried weak plane 11 is usually carried out by applying a heat treatment at a temperature between 800° C. and 1200° C. Such a heat treatment causes cavities and micro-cracks to develop in the buried weak plane 11, and causes the cavities and micro-cracks to be pressurized by the light species present in gaseous form, until a fracture propagates along the weak plane 11. Alternatively, or conjointly, a mechanical stress may be applied to the bonded assembly, and, in particular, to the buried weak plane 11, so as to propagate or assist the mechanical propagation of the fracture leading to the separation. On conclusion of this separation, the composite structure 100 comprising the carrier substrate 20 and the transferred working layer 10 made of single-crystal SiC, on the one hand, and the remainder 1' of the donor substrate, on the other hand, are obtained. The level and the type of doping of the working layer 10 are defined by the choice of the properties of the donor substrate 1 or may be adjusted subsequently via the known techniques for doping semiconductor layers.

The free surface 1*a* of the working layer 10 is usually rough after separation. For example, the free surface 1*a* may have a roughness between 5 nm and 100 nm RMS (AFM, 20 m×20 μm scan). Cleaning and/or smoothing phases may be applied so as to restore a good surface finish (typically, a roughness lower than a few angstroms RMS in a 20 m×20 μm AFM scan). In particular, these phases may comprise a chemical-mechanical treatment for smoothing the free surface of the working layer 10. Removal of an amount between 50 nm and 300 nm makes it possible to effectively restore the surface finish of the layer 10. The phases may also comprise at least one heat treatment at a temperature between 1300° C. and 1800° C. Such a heat treatment is applied to clear residual light species from the working layer 10 and to promote the rearrangement of the crystal lattice of the working layer 10. Such a heat treatment further makes it possible to strengthen the bonding interface 3. A heat treatment in this temperature range may also induce an increase in the size of the grains of the surface layer 22 (and of the second surface layer, if it is present), this being an advantageous way of improving the thermal-conductivity properties of the composite structure 100.

Lastly, it will be noted that the transferring step d) may comprise a step of reconditioning the remainder 1' of the donor substrate with a view to reuse as donor substrate 1 for a new composite structure 100. Mechanical and/or chemical treatments, similar to those applied to the composite structure 100, may be applied to the front side 1'*a* of the remaining substrate 1'. The reconditioning step may also comprise one or more treatments of the edges of the remaining substrate 1' and/or of its back side 1'*b*, by chemical-mechanical polishing, grinding, and/or dry or wet chemical etching.

The present disclosure also relates to the carrier substrate 20 produced in steps a) and b) of the fabricating process detailed above (FIG. 2B), which comprises:

- an initial substrate 21 comprising silicon-carbide grains, the grains having an average size larger than 0.5 m,
- a surface layer 22 placed at least on a front side of the initial substrate 21, comprising silicon-carbide grains, the average size of which is smaller than 500 nm, and preferably smaller than 100 nm, and having a thickness between 50 nm and 50 m, and preferably between 100 nm and 5 μm, or even between 200 nm and 500 nm.

As mentioned with reference to the fabricating process, a layer of the same nature as the surface layer 22 may also be present on the back side and edges of the initial substrate 21, so as to encapsulate the substrate 21. An initial substrate of low quality (sintered substrate, for example) may thus be chosen to limit the cost of the carrier substrate 20.

After step c) of the fabricating process (FIG. 2C), the front side 22*a* of the surface layer of the carrier substrate 20 has a roughness lower than 1 nm RMS, or even lower than or equal to 0.5 nm RMS, and fewer than 10 defects/$cm^2$, or even less than 1 defect/$cm^2$, as measured by reflected dark-field microscopy, with a threshold of 0.5 μm. These characteristics make the carrier substrate 20 particularly suitable for the implementation of a step of molecular bonding between a working layer 10 (or a donor substrate 1) made of single-crystal silicon carbide (or of p-SiC when a second surface layer is present) and the nano-grain p-SiC front side 22*a*.

Lastly, the present disclosure relates to the composite structure 100 produced in the aforementioned fabricating process, which comprises:

- the carrier substrate 20 such as mentioned above,
- a working layer 10 made of single-crystal silicon carbide placed on the surface layer 22.

Such a composite structure 100 is extremely robust to the very high temperature heat treatments liable to be applied to improve the quality of the working layer 10 or to fabricate components on and/or in the layer 10.

The composite structure 100 according to the present disclosure is particularly suitable for the production of one (or more) high-voltage microelectronic component(s), such as, for example, Schottky diodes, MOSFETs, etc. More generally, the composite structure 100 meets the requirements of power microelectronic applications, as it permits an excellent vertical electrical conduction and a good thermal conductivity to be obtained and provides a high-quality c-SiC working layer.

Of course, the present disclosure is not limited to the described examples and embodiments, and variants of embodiment may be employed without departing from the scope of the invention such as defined by the claims.

The invention claimed is:

1. A method of fabricating a composite structure comprising a working layer of single-crystal silicon carbide on a carrier substrate of polycrystalline silicon carbide, the method comprising:

providing an initial substrate of polycrystalline silicon carbide having a front side and comprising grains, the average size of which, in a plane of the front side, is larger than 0.5 μm;

forming a surface layer of polycrystalline silicon carbide on the initial substrate to form the carrier substrate, the surface layer comprising grains, the average size of which is smaller than 500 nm, the surface layer having a thickness between 50 nm and 50 μm;

preparing a free surface of the surface layer of the carrier substrate to obtain a surface roughness lower than 1 nm RMS; and molecularly bonding the working layer to the carrier substrate and transferring the working layer to the carrier substrate, the surface layer being positioned between the working layer and the initial substrate.

2. The method of claim 1, wherein the providing of the initial substrate of polycrystalline silicon carbide comprises depositing the polycrystalline silicon carbide using chemical vapor-deposition, at a temperature between 1100° C. and 1500° C.

3. The method of claim 1, wherein the providing of the initial substrate of polycrystalline silicon carbide comprises forming the polycrystalline silicon carbide by sintering or by depositing the polycrystalline silicon carbide using physical-vapor-deposition.

4. The method of claim 1, wherein the forming of the surface layer comprises depositing the surface layer by chemical vapor-deposition at a temperature lower than or equal to 1100° C.

5. The method of claim 4, wherein the depositing the surface layer by chemical-vapor-deposition is performed at a temperature lower than or equal to 1000° C.

6. The method of claim 4, wherein the forming of the surface layer is carried out in a same item of equipment in which the providing of the initial substrate is carried out and following the providing of the initial substrate, without bringing the initial substrate back to ambient atmosphere.

7. The method of claim 6, wherein the surface layer has a dopant concentration between $1E18/cm^3$ and $1E21/cm^3$.

8. The method of claim 1, wherein the forming of the surface layer is carried out in a same item of equipment in which the providing of the initial substrate is carried out and following the providing of the initial substrate, without bringing the initial substrate back to ambient atmosphere.

9. The method of claim 1, wherein the forming of the surface layer comprises depositing a layer of amorphous silicon carbide on the initial substrate and performing a recrystallization anneal to form the surface layer of polycrystalline silicon carbide.

10. The method of claim 1, wherein the surface layer has a dopant concentration between $1E18/cm^3$ and $1E21/cm^3$.

11. The method of claim 1, wherein the preparing of the free surface of the surface layer comprises chemical-mechanical polishing of the surface layer, and removing an amount of the surface layer between 1 and 10 times the average size of the grains of the surface layer.

12. The method of claim 1, wherein the molecularly bonding of the working layer to the carrier substrate and the transferring of the working layer to the carrier substrate comprises:

providing a donor substrate;

introducing light species into the donor substrate to form a buried weak plane delineating, with a front side of the donor substrate, the working layer to be transferred;

joining the front side of the donor substrate to the carrier substrate, by molecular bonding; and separating along the buried weak plane, leading to the transfer of the working layer to the carrier substrate.

13. The method of claim 12, further comprising forming a second surface layer, of a same nature as the surface layer, on the front side of the donor substrate before or after the introducing of the light species into the donor substrate.

14. The method of claim 12, further comprising, before the joining of the front side of the donor substrate to the carrier substrate, depositing an additional film of a metal or silicon on the surface layer of the carrier substrate and/or on the front side of the donor substrate.

15. A carrier substrate of polycrystalline silicon carbide, comprising:

an initial substrate comprising silicon-carbide grains, the silicon-carbide grains of the initial substrate having an average size larger than 0.5 μm; and a surface layer placed at least on a front side of the initial substrate, the surface layer comprising silicon-carbide grains, the average size of which is smaller than 500 nm, and the surface layer having a thickness comprised between 50 nm and 50 μm.

16. The carrier substrate of claim 15, wherein a free surface of the surface layer has a roughness lower than 1 nm RMS and less than 1 $defect/cm^2$, as measured by reflected dark-field microscopy, with a threshold of 0.5 μm.

17. The carrier substrate of claim 15, wherein the thickness of the surface layer is comprised between 200 nm and 5 μm.

18. The carrier substrate of claim 15, wherein the surface layer has a dopant concentration between $1E18/cm^3$ and $1E21/cm^3$.

19. A composite structure, comprising:

a carrier substrate according to claim 15; and a working layer of single-crystal silicon carbide on the surface layer.

20. The composite structure of claim 19, further comprising at least one power device on or in the working layer.

* * * * *